United States Patent [19]

Bezemer et al.

[11] 4,127,833

[45] Nov. 28, 1978

[54] BAND PASS FILTER

[75] Inventors: Jan A. Bezemer, Zwijndrecht; Herman R. C. Tromp, Bleiswijk, both of Netherlands

[73] Assignee: De Staat der Nederlanden, te Dezen Vertegenwoordigd Door de Directeur-Generaal der Posterijen, Telegrafie en Telefonie, The Hague, Netherlands

[21] Appl. No.: 764,400

[22] Filed: Jan. 31, 1977

[30] Foreign Application Priority Data

Feb. 4, 1976 [NL] Netherlands .......................... 7601124

[51] Int. Cl.² ...................... H03H 9/04; H03H 9/26; H03H 9/32
[52] U.S. Cl. ...................................... 333/72; 310/367
[58] Field of Search ............... 333/72, 71; 331/107 A, 331/116 R, 139, 163–164, 158–162; 310/320, 323, 367, 368, 371; 330/5.5

[56] References Cited

U.S. PATENT DOCUMENTS

| | | | |
|---|---|---|---|
| 2,515,979 | 5/1939 | Hawk ................................... 310/367 |
| 3,638,146 | 1/1972 | Takaku et al. .......................... 333/72 |
| 3,983,518 | 9/1976 | Bezemer ........................... 333/72 X |
| 4,017,753 | 4/1977 | Ishiwata et al. ..................... 310/368 |

*Primary Examiner*—Alfred E. Smith
*Assistant Examiner*—Marvin Nussbaum
*Attorney, Agent, or Firm*—Hugh Adam Kirk

[57] ABSTRACT

Filter chain comprising at least two cascaded duals, each provided with two acoustically coupled resonators, only one of the two resonant frequencies of each of the duals falling within the filter pass band; the duals are convex at least on one side so as to render the acoustic coupling between the resonators so strong that the distance between the two resonant frequencies of the dual is as great as possible.

6 Claims, 15 Drawing Figures

A FILTER CHAIN

FILTER DUAL

FILTER SET

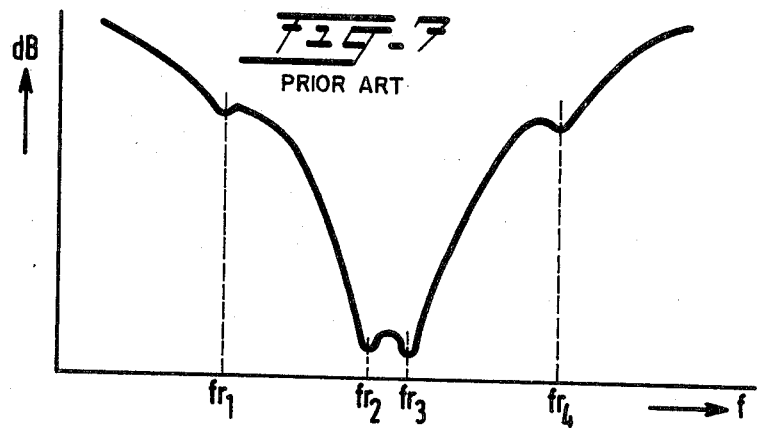
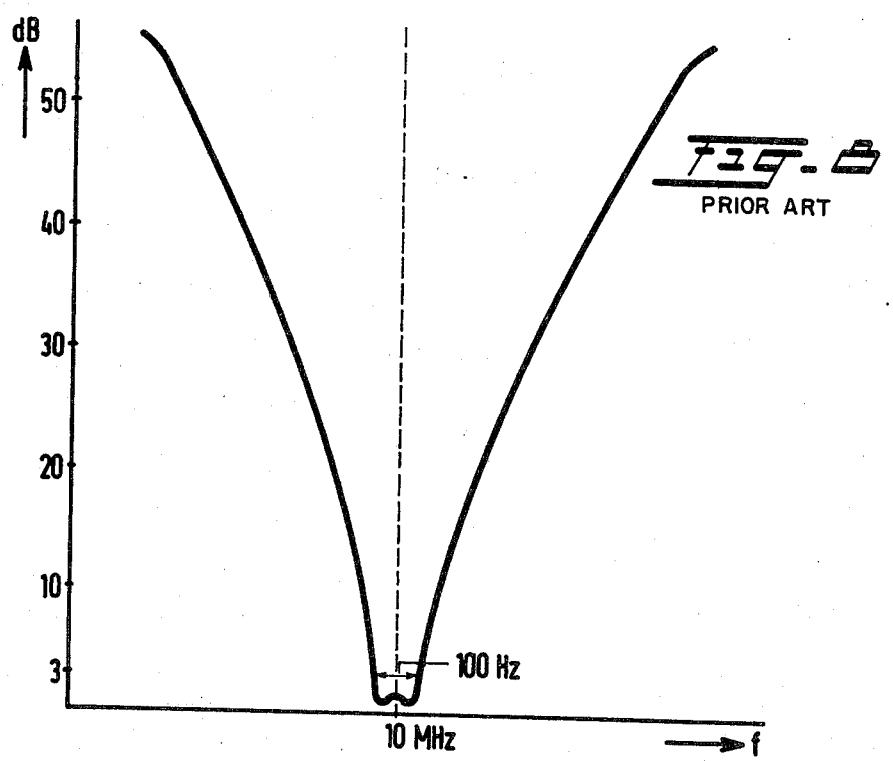
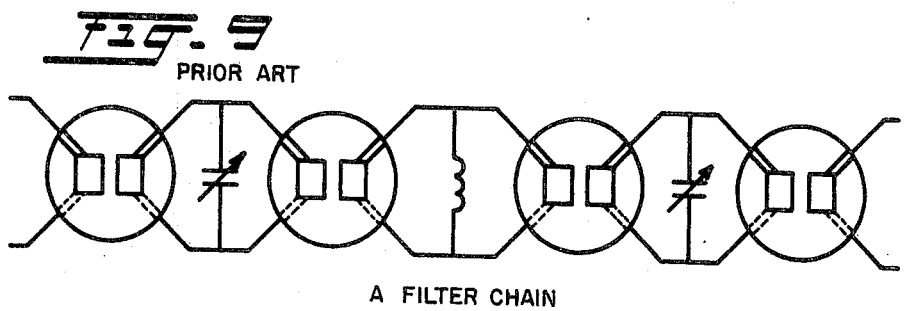
A FILTER CHAIN

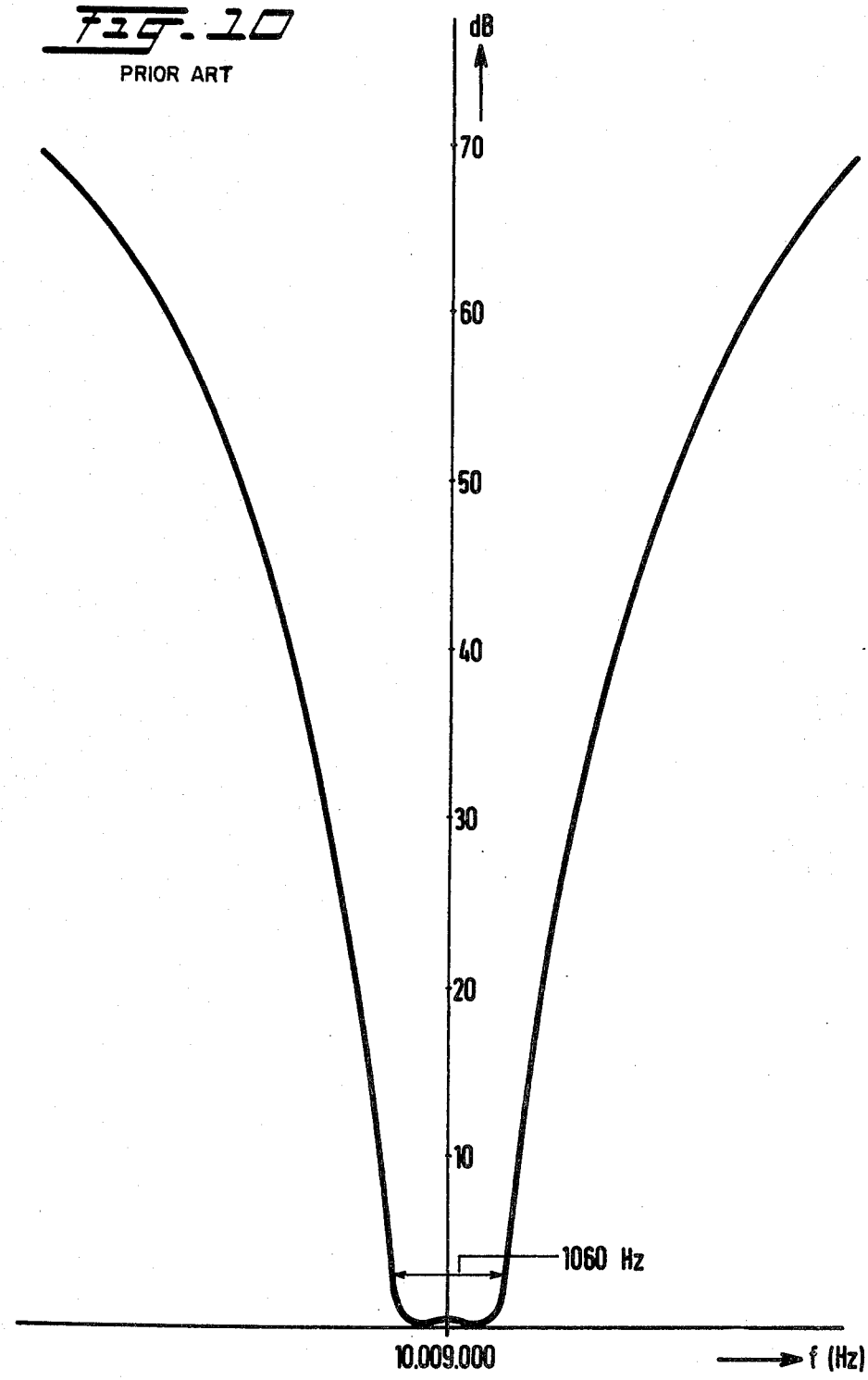

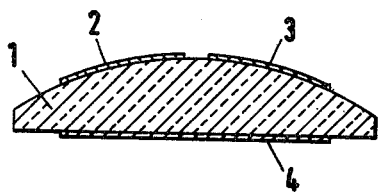
Fig. 11
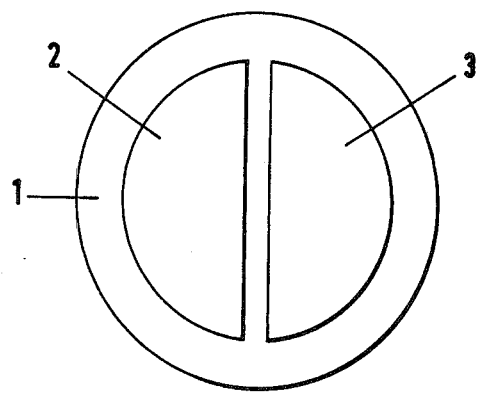
Fig. 12
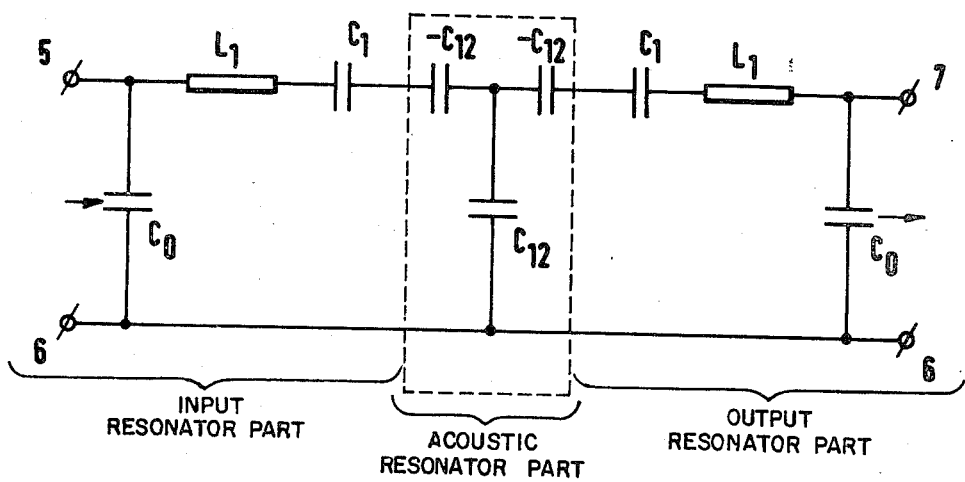

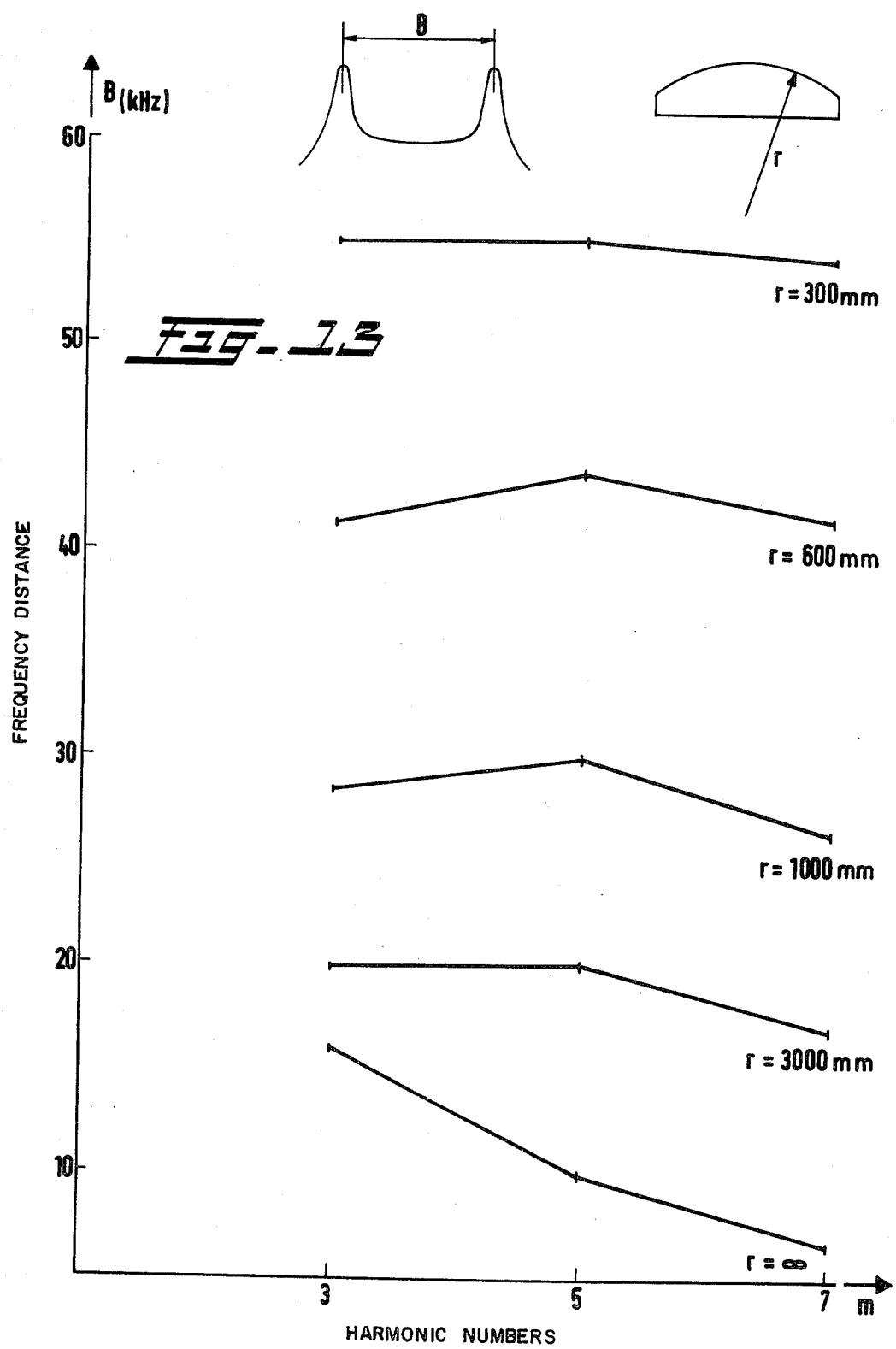

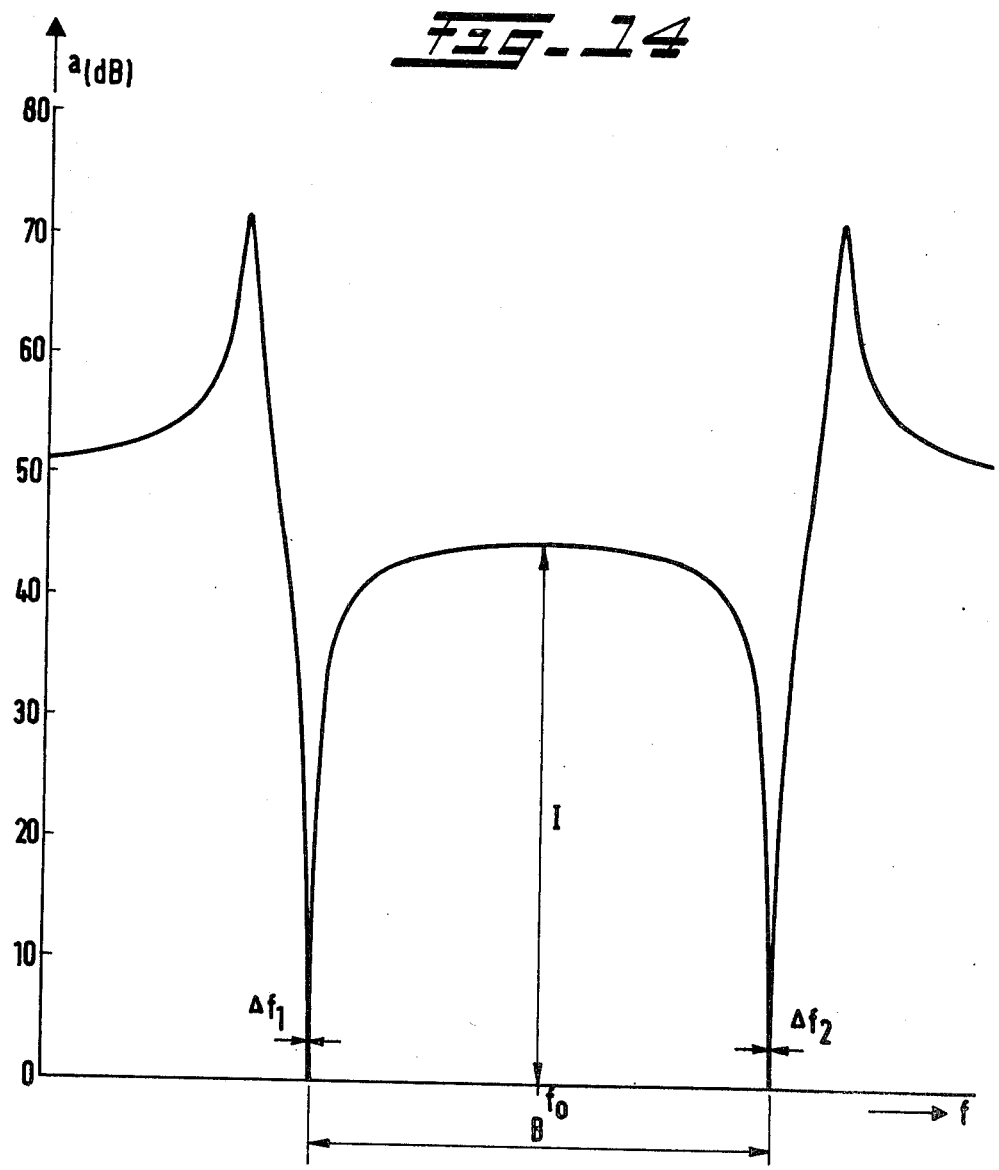

BAND PASS FILTER

BACKGROUND OF THE INVENTION

The invention relates to a filter chain for letting pass a frequency band, comprising a number of filter units made of quartz or other high-quality piezoelectric material, which filter units: vibrate according to the thickness shear mode, are coupled electrically one to another, and are each provided with two acoustically coupled resonators.

The developments in the telecommunication technique tend to increasingly higher carrier current frequencies, so that, for the sake of filtering a narrow frequency band out of these high frequencies, filters with a very small relative bandwidth have become needed.

With a filter consisting of two acoustically coupled resonators, a narrow pass band can, in consequence of the high Q factor, only be realized by means of a small acoustic coupling. The drawbacks of such filter units, however, are a high pass-band attenuation and a high sensitivity for signal levels. Also, the manufacture and the possibility of reproduction of such filter units are difficult and expensive. Moreover, it may be a drawback that the bandwidth of such filters cannot, or only difficulty, be adjusted from the outside after being manufactured.

The problem posed can be solved by starting from a different approach, by which the filter chain comprises one or more filter sets, each having two electrically coupled filter units with at least one equal resonant frequency so that the acoustic coupling coefficient within one filter set is very high with respect to the electric coupling coefficient. This embodiment causes four tuned circuits with three couplings, two of them having a high coupling coefficient and one a low adjustable coupling coefficient. Two of the four resonant frequencies fall within the desired pass band and the other two far outside this pass band. Within a filter set the symmetric resonant frequency of one of the filter units is preferably equal or almost equal to the anti-symmetric resonant frequency of the other filter unit. The acoustic coupling coefficients have to be very high, but not necessarily equal to one another.

However, with the above-mentioned narrow-band filter, it is difficult to maintain the frequency stability. According to known methods, a harmonic filter is made use of in order to obtain a high frequency stability and a high circuit quality Q.

The results thus obtained fully meet the demands made with regard to the frequency stability. However, another drawback is the decrease of the distance between the resonant frequency and the anti-resonant frequency, in consequence of which undesirable frequencies will come too near to the pass-band area.

To obtain a larger distance between the resonant frequency and the antiresonant frequency, the acoustic coupling coefficient must be increased considerably. For this purpose it has been proposed to make use of relatively thin electrodes and to make the distance between the electrodes very small. Although these measures indeed produce some effect, the acoustic coupling on the one hand cannot be made so strong that there is considerable improvement of the distance between the resonant frequency and the anti-resonant frequency, whereas on the other hand there is very little possibility of reproducing of such filter units.

SUMMARY OF THE INVENTION

The present invention is based on the understanding that the acoustic coupling coefficient within one filter unit can be increased considerably by making use of lens action within such a filter unit. The filter chain according to the invention is characterized in that it comprises one or more filter units which are convex at least on one side. In consequence of this the filter units within the filter chain according to the invention present a considerably better acoustic coupling coefficient, and thus a greater distance between the resonant frequency and the anti-resonant frequency than can be obtained in plane-parallel filter units.

OBJECTS AND ADVANTAGES

It is an object of this invention to produce a high-frequency pass band filter unit, that within certain limits, the distance between its resonant frequency and its anti-resonant frequency, is almost independent of the harmonic chosen as well as having a very high quality factor Q.

BRIEF DESCRIPTION OF THE VIEWS

The above mentioned and other features, objects, and advantages, and a manner of attaining them, are described more specifically below by reference to an embodiment of the invention shown in the accompanying the drawings, in which the FIGS. 1 through 10 belong to the background of the invention.

FIG. 7 is the fequency attenuation characteristic curve like FIG. 5 of the circuit according to FIG. 4, but wherein the symmetric resonant frequency of the one dual is almost equal to the anti-symmetric resonant frequency of the other;

FIG. 8 is a frequency attenuation characteristic curve similar to FIG. 7 but of a realized filter set in which the coupling capacitor between the duals is adjusted for a very narrow pass band;

FIG. 9 is a filter chain consisting of filter sets according to FIG. 4;

FIG. 10 is a frequency attenuation characteristic curve of a filter chain of three filter sets;

FIGS. 11a and 11b showing respectively a vertical diametrical cross-sectional view and a plan view of a preferred embodiment of a crystal filter unit or dual according to the invention;

FIG. 12 is an electric equivalent circuit of the dual shown in FIGS. 11a and 11b;

FIG. 13 is a graphical representation showing the order of the harmonics or the harmonic numbers plotted along the X-axis and the distance between the resonant frequency and the anti-resonant frequency of a filter unit as shown in FIGS. 11a and 11b plotted along the Y-axis, the parameter being the radius of curvature of the top of a filter unit having a fundamental frequency of 2 MHz, which filter unit has a flat bottom; and FIG. 14 is a response curve of a filter unit as shown in FIGS. 11a and 11b and according to the invention.

DETAILED DESCRIPTION OF PRIOR ART

Figure 1:
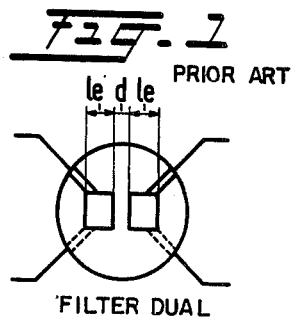
FIG. 1 is a diagram of a monolith provided with two pairs of resonators which together form a filter unit.

For composing the filter chain use is made of standard duals with two resonators, between which there exists a very strong acoustic coupling. The absolute value of the coupling coefficient is of secondary importance. Either the symmetric or the anti-symmetric resonant frequencies of the standard duals are equal. This will be further elucidated in what follows. The strong acoustic coupling is realized by menas of:
1. very thin electrodes;
2. small dimensions le in FIG. 1 of the electrodes in the direction of the acoustic coupling axis, and
3. very little spaced between the resonators.

A dual having a predetermined resonant frequency can be made in the same way as a single crystal. So, these standard duals can be easily produced and their properties can be properly reproduced. The two resonant frequencies of a dual are $$fr = f_0(1 \pm \frac{C_1}{2C_{12}})\quad\text{(FIG. 2)}.$$

Figure 2:
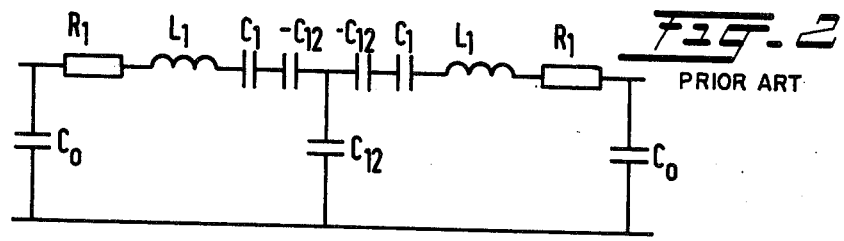
FIG. 2 is a circuit diagram of the filter unit or dual according to FIG. 1.
Figure 3:
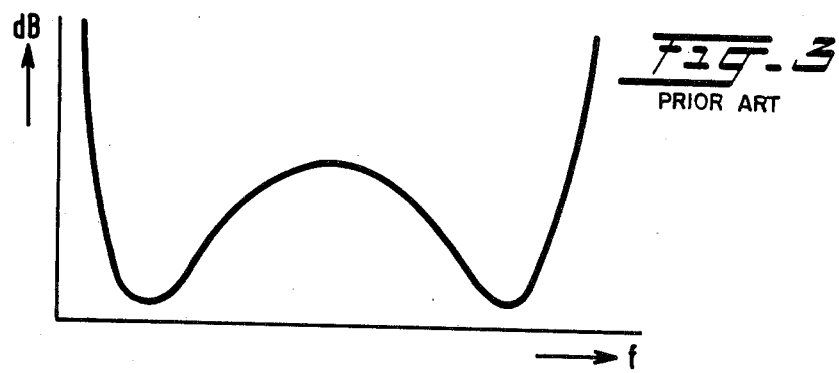
FIG. 3 is the frequency attenuation characteristic curve according to FIGS. 1 and 2.

Likewise it can be derived from FIG. 2 that the acoustic coupling coefficient is $ka = C_1/C_{12}$. If the coupling coefficient ka is very high, the two resonant frequencies will lie far apart. The frequency attenuation characteristic of such a dual is represented in FIG. 3.

Figure 4:
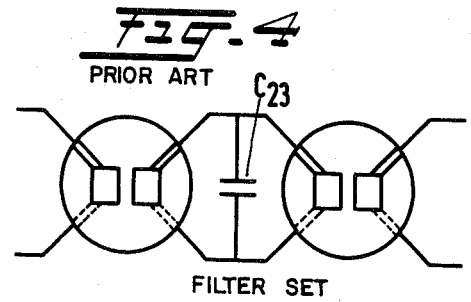
FIG. 4 is a diagram of a filter set consisting of two equal duals according to FIG. 1 with a capacitive coupling impedance.

FIG. 4 shows two standard duals, which are connected in tandem by means of a coupling capacitor $C_{23}$. Such a circuit is called a filter set in this description. A filter set has 4 resonant frequencies.

Figure 5:
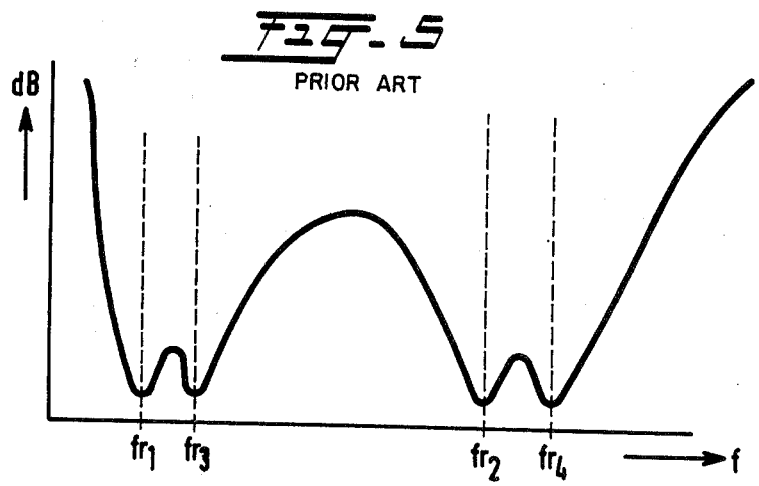
FIG. 5 is the frequency attenuation characteristic curve of the circuit according to FIG. 4 showing the valleys for the four resonant frequencies $fr_1$, $fr_2$, $fr_3$ and $fr_4$ of each filter in the set.

FIG. 5 shows a frequency attenuation characteristic of a filter set, the symmetric and the anti-symmetric resonances being almost equal and each forming a pair ($fr_1$ and $fr_3$, $fr_2$ and $fr_4$). The difference between the frequencies $fr_1$ and $fr_3$ and between the frequencies $fr_2$ and $fr_4$ is determined by the value of the capacitor $C_{23}$. The electric coupling coefficient between the two filter units ke is approximately expressed by $ke = C_1/C_{23}$.

Figure 6:
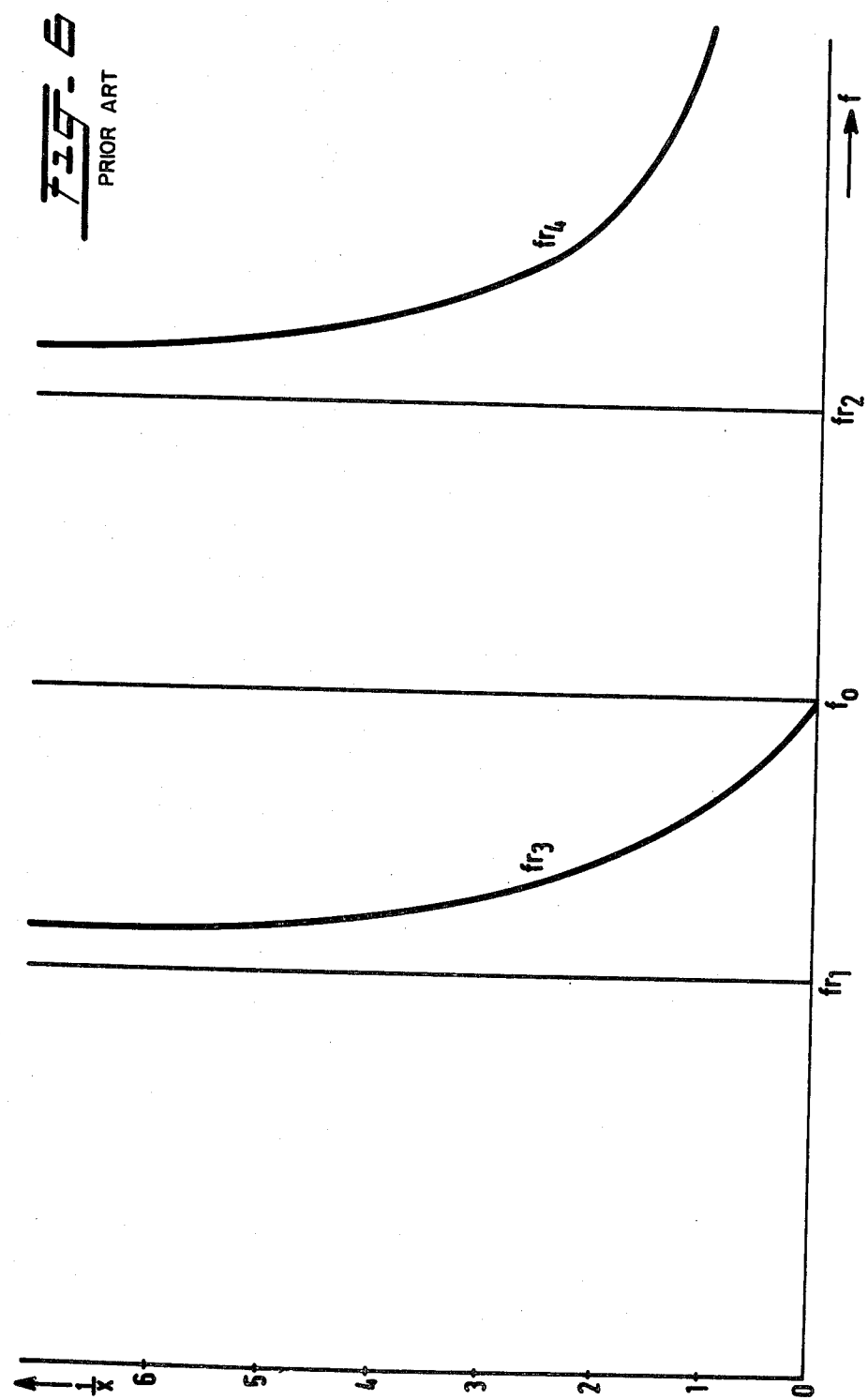
FIG. 6 is a graphical representation of the connection between the frequency and the ratio between the acoustic coupling coefficient and the electric coupling coefficient for a filter set as shown in FIG. 4.

In FIG. 6 the ratio between the electric coupling coefficient and the acoustic coupling coefficient is plotted against the frequency, the four resonant frequencies acting as a parameter. This ratio $x = ke/ka$ is approximately expressed by $x = C_{12}/C_{23}$. So, if the acoustic coupling coefficient is much higher than the electric coupling coefficient, so that, consequently, $1/x$ is large, $fr_1$ and $fr_3$ as well as $fr_2$ and $fr_4$ will lie close to one another. A change of the value of the capacitor $C_{23}$ and, consequently, of $1/x$ causes a change of these distances.

Starting from the circuit as described above it is now possible to make a filter in which the frequencies $fr_1$ and $fr_3$ fall within the pass band and the frequencies $fr_2$ and $fr_4$ far outside the pass band. Thus a frequency attenuation characteristic will be obtained as represented in FIG. 5. The distance between the frequencies $fr_2$ and $fr_4$, as well as the distance between the frequencies $fr_2$ and $fr_4$ on the one side and the frequencies $fr_1$ and $fr_3$ on the other side, are no longer of any importance. In an analogous way it is possible to make a filter in which two duals are coupled, the symmetric resonant frequency of the one dual being equal to the anti-symmetric resonant frequency of the other. Thus a frequency attenuation characteristic will be obtained as represented by FIG. 7.

By varying the value of the capacitor $C_{23}$ the difference between the frequencies $fr_2$ and $fr_3$ can be changed, so that the bandwidth of the filter set is adjustable from the outside. This filter set has a very narrow pass band as can be derived from FIG. 8. For improving the edge steepness several filter sets can be connected in tandem (FIG. 9). For this purpose self-inductances are chosen as coupling impedances.

FIG. 10 shows the frequency attenuation characteristic of three filter sets connected in tandem. This filter is free from secondary resonances and the ripple is smaller than 0.3 dB.

DETAILED DESCRIPTION OF A PREFERRED EMBODIMENT

A preferred embodiment of a filter unit according to the invention is represented by FIG. 11a in cross-section, whereas FIG. 11b shows a top view of the same. Such a filter unit or dual consists of a round plate 1 made of quartz and having a flat bottom and a convex top. The electrodes 2 and 3 have been vapour-deposited at the top and the common electrode 4 has been vapour-deposited at the bottom of the said plate. Thus the input resonator is formed by the electrodes 2 and 4, and the output resonator is formed by the electrodes 3 and 4.

FIG. 12 shows an electric equivalent circuit of the dual according to FIG. 11. In this FIG. 12 the input resonator is represented by $C_0$, $L_1$ and $C_1$, connected to the terminals 5 and 6; the output resonator is represented by $C_1$, $L_1$ and $C_0$, connected to the terminals 7 and 6, and an acoustic coupling between the input resonator and the output resonator is represented electrically by the T-network enclosed by dashed lines and formed by the capacitances $-C_{12}$, $C_{12}$ and $-C_{12}$.

As has already been described above, the distance, say B between the resonant frequency and the anti-resonant frequency is expressed by:

$$B = \frac{f_o}{\frac{C_{12}}{C_1}} \quad\text{(1)}\quad\text{(see also FIG. 14)}$$

From this it can be derived that the distance B, at a given centre frequency $f_0$, is as great as possible, when the quotient $C_{12}/C_1$ is a minimum. It is known that $C_1 \propto 1/m^3$ and that $C_{12} \propto 1/m$ in which $m$ stands for the harmonic number. From this it appears that the quotient $C_{12}/C_1$ is unfavourably influenced by the use of a harmonic filter. As $C_1$ is determined by the filter data and $C_{12}$ may not be attributed any other meaning than that of a calculating quantity, it seems to be useful to express the frequency distance B in a different way.

From the general filter theory it can be demonstrated that for the acoustic coupling coefficient $k$ it applies that:

$$k \approx C_1/C_{12} \quad\text{(2)}$$

From the formulae (1) and (2) the relation between the frequency distance B and the acoustic coupling coefficient $k$ can now be expressed as follows:

$$B = k \times f_o \qquad (3)$$

From the formulae (3) it can be derived that the frequency distance B is a maximum with a maximum coupling coefficient k.

According to the invention this acoustic coupling coefficient k is now increased by grinding the dual in such a way that it is at least on one side more convex than on the other. It can be expected that the acoustic coupling increases because of the lens action.

FIG. 13 shows a graphical representation in which the relation between the frequency distance B and the harmonic numbers $m = 3, 5$ and 7 respectively corresponding with 6, 10 and 14 MHz, respectively, is shown by a fundamental frequency of 2 MHz for the various radii of curvature of a filter unit; in this FIG. 13 the radius of curvature of a plane-parallel filter unit is designated by $r = \infty$. It clearly appears that the smaller the radius of curvature is, the greater the frequency distance B is; at different harmonic numbers. Moreover, the harmonic number of the dual according to the invention of a lens or spherical sector shaped crystal has hardly any influence on the frequency distance. When choosing a higher harmonic number, however, the relative bandwidth $\Delta f/f_o$ of the small pass bands $\Delta f_1$ and $\Delta f_2$ will increase within certain limits, whereas the interresonance attenuation I (see FIG. 14) decreases, also because of crosstalk between the input resonator and the output resonator.

In a preferred embodiment of a dual according to the invention having a flat bottom and a convex top with a radius of curvature of 600 mm the following values, corresponding to various values of the terminal resistance $R_{afs}$ expressed in ohms, were found for the quantities B, I, $\Delta f_1$, $\Delta f_2$ and $f_o/\Delta f_{gem}$ (=average):

| Harmonic number m | $f_o$ in MHz | $R_{afs}$ in ohms | B in kHz | I in dB | $\Delta f_1$ in Hz | $\Delta f_2$ in Hz | Filter Quality $Q = \dfrac{f_o}{\Delta f_{gem}}$ | |
|---|---|---|---|---|---|---|---|---|
| 3 | 6 | 50 | 39,4 | 45 | 26 | 34 | 20 | $10^4$ |
|   |   | 250 | 39,4 | 42 | 56 | 60 | 10 | $10^4$ |
|   |   | 500 | 39,4 | 48 | 88 | 100 | 6,4 | $10^4$ |
| 5 | 10 | 50 | 42,4 | 42 | 31 | 30 | 33,3 | $10^4$ |
|   |   | 250 | 42,3 | 38 | 48 | 56 | 23,8 | $10^4$ |
|   |   | 500 | 42,4 | 34 | 68 | 84 | 13,2 | $10^4$ |
| 7 | 14 | 50 | 39,4 | 30 | 40 | 52 | 30 | $10^4$ |
|   |   | 250 | 39,4 | 27 | 56 | 64 | 23,3 | $10^4$ |
|   |   | 500 | 39,4 | 26 | 56 | 75 | 21,2 | $10^4$ |
| 9 | 18 | 50 | 39,8 | 24 | 75 | 70 | 25 | $10^4$ |
|   |   | 250 | 39,7 | 23 | 84 | 120 | 17,6 | $10^4$ |
|   |   | 500 | 39,8 | 22 | 100 | 120 | 16,4 | $10^4$ |

For the construction of filters with a very narrow band as described above $\Delta f_1$ and $\Delta f_2$ have anyhow to be smaller than the desired filter bandwidth, and the interresonance attenuation I has to be as large as possible for an optimum edge steepness.

From the above table it appears that although the harmonic number has only very little influence on the frequency distance B, the choice of too high a harmonic number m can unfavourably influence the bandwidth of the small pass bands $\Delta f_1$ and $\Delta f_2$ and the interresonance attenuation I and, consequently, the edge steepness of the final filter.

The filter quality Q, however, expressed by $Q = f_o/\Delta f$, is optimum at the 5th harmonic number and can even rise to $10^6$.

While there has been described above the principles of this invention in connection with specific apparatus, it is to be clearly understood that this description is made only by way of example and not as a limitation to the scope of this invention.

What we claim is:

1. Filter chain for passing a band of frequencies, comprising a number of filter units, each of which units are: made of a high-quality piezoelectric material, vibrate according to the thickness shear mode, coupled electrically one to another, and contain two mainly acoustically coupled resonators; the filter chain comprising at least one filter set having two electrically coupled filter units, wherein each unit has at least one resonant frequency which is the same as one of the resonant frequencies in each of the units; and said filter units being convex at least on one side, whereby the acoustic coupling coefficient within one filter set is very high with respect to its electric coupling coefficient.

2. Filter chain according to claim 1, wherein at least one filter unit is disc-shaped, being flat on one side and convex on the opposite side.

3. A narrow frequency band high frequency filter set comprising at least one electrically and variably coupled pair of dual filters, each dual of said pair having a high acoustic coupling coefficient relative to its electric coupling coefficient and comprising:

(A) a spherical sector shaped high-quality piezoelectric material, flat on one side and convex on the other, (B) a common input and output electrode on said flat side, (C) separate spaced input and output electrodes on said convex side, and (D) a common resonant frequency.

4. A filter dual according to claim 3 wherein said electrodes are vapor-deposited on said piezoelectric material.

5. A filter dual according to claim 3 wherein said high-quality piezoelectric material is quartz.

6. A filter dual according to claim 3 wherein said separate spaced input and output electrodes are semicircular in shape.

* * * * *

UNITED STATES PATENT AND TRADEMARK OFFICE
CERTIFICATE OF CORRECTION

PATENT NO. : 4,127,833

DATED : November 28, 1978

INVENTOR(S) : Jan A. Bezemer et al

It is certified that error appears in the above-identified patent and that said Letters Patent are hereby corrected as shown below:

Column 1, line 10, after "two" insert - - mainly - - ; line 27, change "difficulty" to - - difficultly - - ; line 68, cancel "of" (second occurrence). Column 2, line 36, after "curve" insert - - of a dual - - . Column 5, line 22, omit the semicolon after "is". Column 6, line 28, change "units" (second occurrence) to - - unit - - .

Signed and Sealed this

Tenth Day of April 1979

[SEAL]

Attest:

RUTH C. MASON
Attesting Officer

DONALD W. BANNER
Commissioner of Patents and Trademarks